United States Patent
Fuhrer et al.

(10) Patent No.: US 10,546,992 B2
(45) Date of Patent: Jan. 28, 2020

(54) BURIED ELECTRODE GEOMETRY FOR LOWERING SURFACE LOSSES IN SUPERCONDUCTING MICROWAVE CIRCUITS

(71) Applicant: International Business Machines Corporation, Armonk, NY (US)

(72) Inventors: Andreas Fuhrer, Zurich (CH); Andreas Kuhlmann, Basel (CH); Ute Drechsler, Rueschlikon (CH); Veeresh V. Deshpande, Leuven (BE); Stefan Filipp, Zurich (CH); Marc Ganzhorn, Muhen (CH)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/021,202

(22) Filed: Jun. 28, 2018

(65) Prior Publication Data
US 2020/0006619 A1    Jan. 2, 2020

(51) Int. Cl.
*H01L 39/02* (2006.01)
*H01P 3/08* (2006.01)
(Continued)

(52) U.S. Cl.
CPC ......... *H01L 39/025* (2013.01); *G06N 10/00* (2019.01); *H01L 39/223* (2013.01); *H01L 39/2493* (2013.01); *H01P 3/08* (2013.01)

(58) Field of Classification Search
CPC . H01L 39/025; H01L 39/223; H01L 39/2493; H01L 39/045; G06N 10/00; H01P 3/08; H01P 3/081; H01P 3/085
See application file for complete search history.

(56) References Cited

U.S. PATENT DOCUMENTS

| 4,956,312 A | 9/1990 | Van Laarhoven |
| 8,954,125 B2 | 2/2015 | Gonzalez et al. |

(Continued)

FOREIGN PATENT DOCUMENTS

| WO | 2016199029 A1 | 12/2016 |
| WO | 2017001951 A1 | 1/2017 |

(Continued)

OTHER PUBLICATIONS

Bishop et al., "Quantum Volume," Technical report, 2017, 5 pages.
(Continued)

*Primary Examiner* — Nikolay K Yushin
(74) *Attorney, Agent, or Firm* — Cantor Colburn LLP; Daniel Morris (57) ABSTRACT

Embodiments are directed to a superconducting microwave circuit. The circuit includes a substrate and two electrodes. The latter form an electrode pair dimensioned so as to support an electromagnetic field, which allows the circuit to be operated in the microwave domain. The substrate exhibits a raised portion, which includes a top surface and two lateral surfaces. The top surface connects the two lateral surfaces, which show respective undercuts (on the lateral sides of the raised portions). Each of the electrodes includes a structure that includes a potentially superconducting material. Two protruding structures are accordingly formed, which are shaped complementarily to the respective undercuts. This way, the shaped structure of each of the electrodes protrudes toward the other one of the electrodes of the pair.

18 Claims, 6 Drawing Sheets

(51) Int. Cl.
    *H01L 39/24*    (2006.01)
    *H01L 39/22*    (2006.01)
    *G06N 10/00*    (2019.01)

(56) References Cited

U.S. PATENT DOCUMENTS

| | | | |
|---|---|---|---|
| 9,177,814 | B2 | 11/2015 | Chang et al. |
| 9,524,470 | B1 | 12/2016 | Chow et al. |
| 9,564,573 | B1* | 2/2017 | Chang .................. H01L 39/025 |
| 2003/0136973 | A1 | 7/2003 | Ogawa et al. |
| 2015/0372217 | A1 | 12/2015 | Schoelkopf, III et al. |
| 2016/0292587 | A1 | 10/2016 | Rigetti et al. |
| 2016/0380026 | A1 | 12/2016 | Abraham et al. |
| 2017/0033273 | A1* | 2/2017 | Chang .................. H01L 39/025 |

FOREIGN PATENT DOCUMENTS

| | | | |
|---|---|---|---|
| WO | 2017021714 | A1 | 2/2017 |
| WO | 2017116439 | A1 | 7/2017 |
| WO | 2017116442 | A1 | 7/2017 |

OTHER PUBLICATIONS

Bruno et al., "Reducing intrinsic loss in superconducting resonators by surface treatment and deep etching of silicon substrates," Applied Physics Letters 106.18, 2015, 182601, 4 pages.

Calusine et al., "Analysis and mitigation of interface losses in trenched superconducting coplanar waveguide resonators," arXiv preprint arXiv:1709.10015, 2017, 10 pages.

Chiaro et al., "Dielectric surface loss in superconducting resonators with flux-trapping holes," Superconductor Science and Technology 29.10, 2016, 104006, 8 pages.

Corcoles et al., "Protecting superconducting qubits from radiation," Applied Physics Letters 99.18, 2011, 181906, 3 pages.

Dial et al., "Bulk and surface loss in superconducting transmon qubits," Superconductor Science and Technology 29.4, 2016, 044001, 5 pages.

Dunsworth et al., "Characterization and Reduction of Capacitive Loss Induced by Sub-Micron Josephson Junction Fabrication in Superconducting Qubits," arXiv preprint arXiv:1706.00879, 2017, 9 pages.

Fowler et al., "High threshold universal quantum computation on the surface code," arXiv preprint arXiv:0803.0272, 2008, 18 pages.

Gambetta et al., "Investigating Surface Loss Effects in Superconducting Transmon Qubits," IEEE Transactions on Applied Superconductivity 27.1, 2017, 1700205, 5 pages.

Gao et al., "Experimental evidence for a surface distribution of two-level systems in superconducting lithographed microwave resonators," Applied Physics Letters 92.15, 2008, 152505, 3 pages.

Geerlings et al., "Improving the quality factor of microwave compact resonators by optimizing their geometrical parameters," Applied Physics Letters 100.19, 2012, 192601, 4 pages.

Koch et al., "Charge-insensitive qubit design derived from the Cooper pair box," Physical Review A 76.4, 2007, 042319, 19 pages.

Kumar et al., "Origin and Reduction of 1/f Magnetic Flux Noise in Superconducting Devices," Physical Review Applied 6.4, 2016, 041001, 5 pages.

Martinis et al., "Decoherence in Josephson Qubits from Dielectric Loss," Physical Review Letters 95.21, 2005, 210503, 4 pages.

Megrant et al., "Planar superconducting resonators with internal quality factors above one million," Applied Physics Letters 100.11, 2012, 113510, 5 pages.

Muller et al., "Towards understanding two-level-systems in amorphous solids—Insights from quantum devices," arXiv preprint arXiv:1705.01108, 2017, 30 pages.

Proslier et al., "Atomic Layer Deposition of Superconductors," ECS Transactions 41.2, 2011, pp. 237-245.

Sage et al., "Study of loss in superconducting coplanar waveguide resonators," Journal of Applied Physics 109.6, 2011, 063915, 10 pages.

Wang et al., "Surface participation and dielectric loss in superconducting qubits," Applied Physics Letters 107.16, 2015, 162601, 6 pages.

Wenner et al., "Surface loss simulations of superconducting coplanar waveguide resonators," Applied Physics Letters 99.11, 2011, 113513, 3 pages.

Quintana et al., "Characterization and reduction of microfabrication-induced decoherence in superconducting quantum circuits," Applied Physics Letters 105, 2014, 062601, 6 pages.

* cited by examiner

BURIED ELECTRODE GEOMETRY FOR LOWERING SURFACE LOSSES IN SUPERCONDUCTING MICROWAVE CIRCUITS

BACKGROUND

The present invention generally relates to the field of superconducting microwave circuits operating in the microwave regime, as well as related devices and methods of fabrication thereof. Embodiments of the present invention improve quality factors of resonators and/or qubit lifetimes (for quantum information processing devices) through the reduction of microwave photon interactions with the surrounding materials.

The reduction of microwave photon interactions with the environment is needed for increasing the fidelity of quantum gate operations and reaching thresholds to run quantum algorithms. The main source of unwanted microwave photon interactions (e.g., microwave photon losses, the photon phase effects, etc.,) in superconducting circuits is believed to arise due to electromagnetic coupling to imperfections or adsorbates at material interfaces in the vicinity of the qubit. Three types of interfaces are typically identified: the (i) substrate-to-air (SA), substrate-to-metal (SM), and metal-to-air (MA) interfaces. The probability for a microwave photon to be absorbed at any of these interfaces is usually assumed to be proportional to the integrated energy density (ED) of the electric field distribution of the corresponding microwave excitation over the volume of the interface, referred to as the participation ratio of the interface. The microscopic origin is often attributed to the presence of an ensemble of two-level fluctuators in amorphous materials such as native oxides or surface adsorbate layers that couple to the microwave field through their dipole moments. Similarly, magnetic two-level fluctuators such as adsorbed oxygen molecules or some hydrogen bond species are believed to limit the coherence ($T_2$) times of flux tunable qubits. To mitigate this issue, planar qubit and coplanar waveguide (CPW) designs have been made larger (lateral sizes of several hundreds of micrometers) such that the participation of interface layers in the electromagnetic field energy density (EMFED) would become negligible and interface loss is reduced. This has led to improvements of qubit $T_1$ times (to more than 100 µs).

Qubit lifetimes need to be further improved to achieve efficient quantum computing (QC) architectures. However, qubit size cannot be indefinitely increased, due to the need of scalability and packaging of multiqubit chips. Moreover, increasing the qubit size will only yield a logarithmic improvement of the interface participation.

The MA interface is known to have very low participation in the EMFED. The SM interface can be engineered and/or improved during fabrication, because it is not exposed to ambient conditions during packaging and transfer of the qubit chips into the measurement system (dilution refrigerator). Finally, the dominating SA interface cannot easily be improved. One reason is that the known "passivation" methods happen to deteriorate the qubit lifetimes.

SUMMARY

According to embodiments of the invention, a superconducting microwave circuit is provided. The circuit comprises a substrate and two electrodes. The two electrodes form an electrode pair dimensioned so as to support an electromagnetic field, which allows the circuit to be operated in the microwave domain. The substrate exhibits a raised portion, which includes a top surface and two lateral surfaces. The top surface connects the two lateral surfaces, which show respective undercuts (on the lateral sides of the raised portions). Each of the electrodes comprises a structure that includes a potentially superconducting material. Two protruding structures are accordingly formed, which are shaped complementarily to the respective undercuts. This way, the shaped structure of each of the electrodes protrudes toward the other one of the electrodes of the pair.

According to embodiments of the invention, a method of fabricating a superconducting microwave circuit is provided. This method includes a substrate that is patterned so as to obtain a raised portion as described above. This portion includes a top surface and two lateral surfaces with respective undercuts, where the top surface connects the two lateral surfaces. Two electrodes are complementarily patterned to form an electrode pair as described above. Namely, this pair is dimensioned so as to support an electromagnetic field that allows the circuit to be operated in the microwave domain. Each electrode comprises a structure with a potentially superconducting material, hence yielding two protruding structures shaped complementarily to the respective undercuts and the structure of one of the electrodes protrudes toward the other one of the electrodes.

Superconducting circuits (as well as related devices) and fabrication methods embodying the present invention will now be described, by way of non-limiting examples, and in reference to the accompanying drawings.

BRIEF DESCRIPTION OF THE DRAWINGS

The accompanying figures, where like reference numerals refer to identical or functionally similar elements throughout the separate views, and which together with the detailed description below are incorporated in and form part of the present specification, serve to further illustrate various embodiments and to explain various principles and advantages all in accordance with the present disclosure, in which.

The accompanying drawings show simplified representations of devices or parts thereof, as involved in embodiments. Technical features depicted in the drawings are not necessarily to scale. Similar or functionally similar elements in the figures have been allocated the same numeral references, unless otherwise indicated.

DETAILED DESCRIPTION

As noted in the background section, the dominating substrate-to-air (SA) interface cannot easily be improved for existing electrode geometries. Therefore, embodiments of the invention provide electrode designs and fabrication methods that make reduce the participation ratio of the critical SA interface. Such designs rely on a superconducting electrode geometry that urges the electromagnetic field (EMF) energy into the substrate (i.e., below top surfaces of raised portions of the substrate). The proposed structures can be fabricated with extremely low impurity levels in the substrate, which can for instance be a single crystal (e.g., sapphire, silicon) or a high-quality layered substrate such as a semiconductor heterostructure.

For ease of understanding and not limitation, the following description is structured as follows. First, general embodiments of the invention and high-level variants are described. The next section addresses more specific embodiments and technical implementation details. This section further discusses results obtained for the present circuits, in terms of EMF confinement.

In reference to FIGS. 1-3, a superconducting microwave circuit 1, 1a, 1b is discussed. FIG. 1A is a top view of a portion of the superconducting microwave circuit 1, showing capacitor plates and a surrounding structure of a superconducting qubit, according to embodiments of the invention. FIG. 1B is another top view of a certain portion of the superconducting microwave circuit 1 where some layers are transparent or have been removed for ease of understanding. FIGS. 1C and 1D are cross-sectional views of two variants of the superconducting microwave circuit 1, respectively labeled superconducting microwave circuit 1a and 1b, taken from FIG. 1B. The plane upon which the cross-sectional views in FIGS. 1C and 1D is taken is indicated by the dashed line in FIG. 1B. FIG. 1C shows a Josephson junction formed on top of a middle, residual raised portion of the substrate, to connect two adjoining superconducting material portions (electrodes). In FIG. 1D, the raised portion of the substrate is assumed to be fully interrupted at the level of the cutting plane and the junction is buried. FIG. 1B shows both a substrate with a raised portion and a conducting material extending over the substrate, except at the level of the raised portions. The substrate and the conducting material are not shown in FIG. 1A because a superconducting layer coats the substrate (including undercuts thereon) and the top surface of the raised portion of the substrate. More detail is now discussed.

Figure 1A:
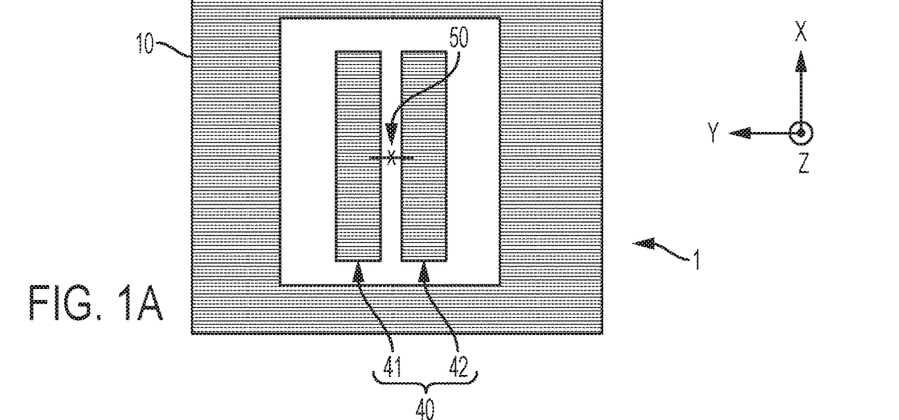
FIG. 1A depicts a top view of a portion of a superconducting microwave circuit, showing capacitor plates and a surrounding structure of a superconducting qubit, according to embodiments of the invention.
Figure 1B:
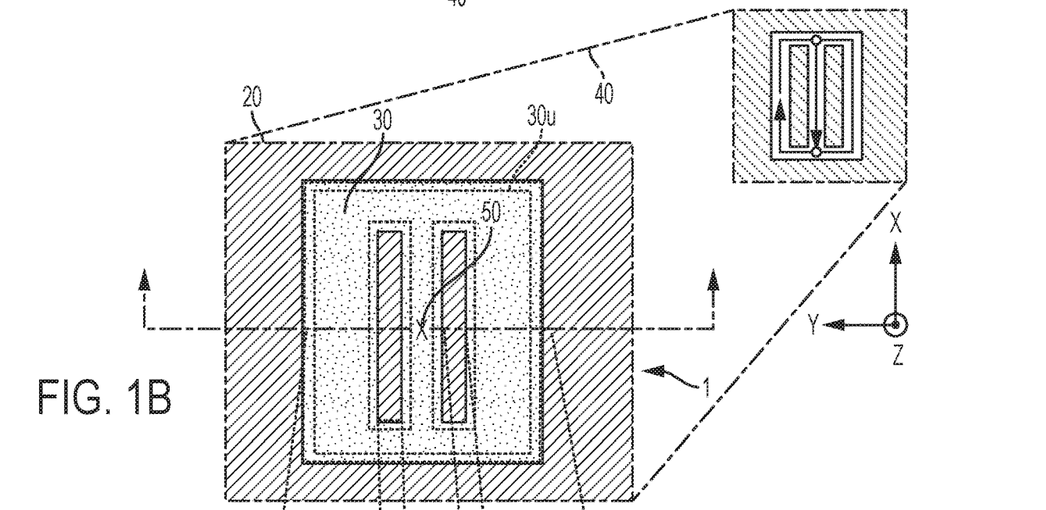
FIG. 1B depicts another top view of a certain portion of the superconducting microwave circuit according to embodiments of the invention.
Figure 1C:
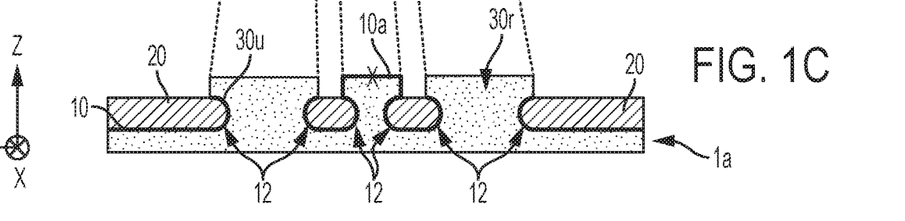
FIG. 1C depicts a cross-sectional view of a variant of the superconducting microwave circuit in FIG. 1B, which shows a Josephson junction formed on top of a middle, residual raised portion of the substrate, to connect two adjoining superconducting material portions (electrodes) according to embodiments of the invention.
Figure 1D:
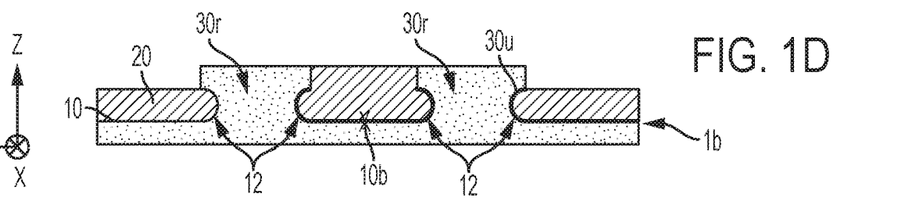
FIG. 1D depicts a cross-sectional view of another variant of the superconducting microwave circuit in FIG. 1B, in which the raised portion of the substrate is to be fully interrupted at the level of the cutting plane and the junction is buried according to embodiments of the invention.

The circuit 1 includes a substrate 30, which is structured so as to exhibit at least one raised portion 30$r$ seen in FIGS. 1C and 1D. In practice, however, the substrate will typically include several raised portions, as also depicted in FIGS. 2D and 2E. Conversely, the substrate can include at least one raised portion that is structured so as to exhibit distinct sections, as in FIGS. 1C and 1D (and also in FIGS. 2D and 2E). In all cases, any such raised portion 30$r$ of the substrate shows a top surface TS and two lateral surfaces LS.

Figure 3A:
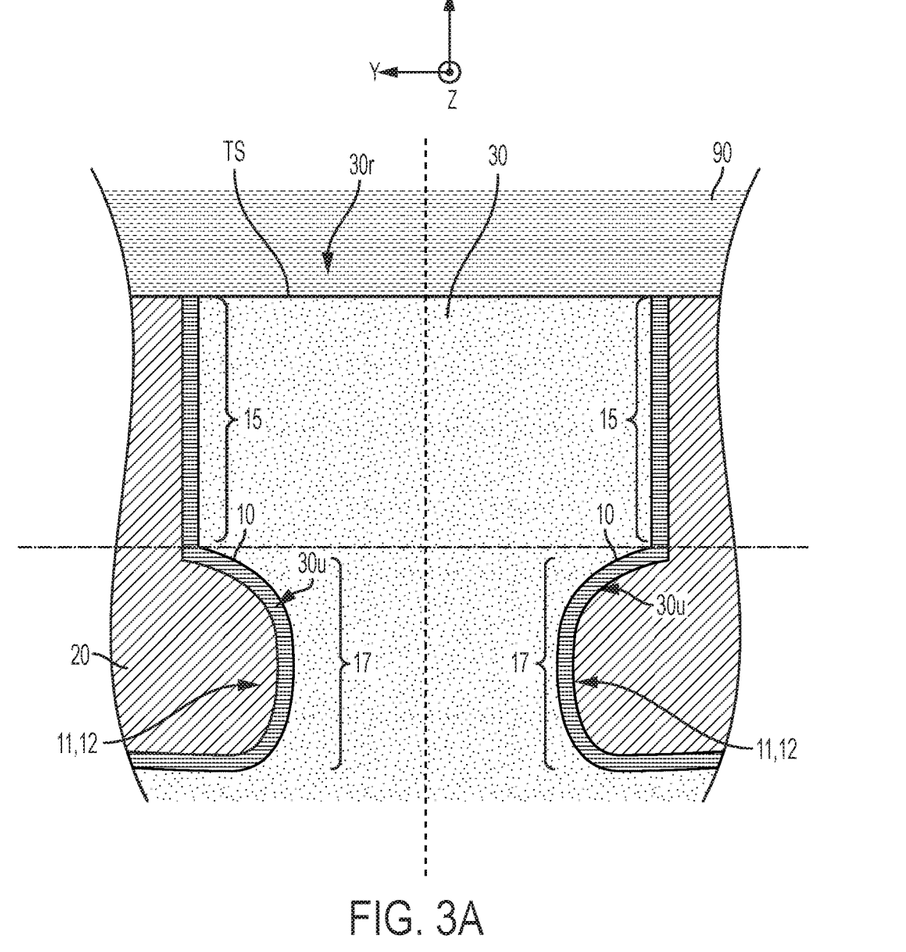
FIG. 3A depicts a cross-sectional view of a magnified electrode pair geometry, whose opposite electrodes have inwardly protruding structures that are shaped complementarily with undercuts of a raised portion of a substrate, according to embodiments of the invention.
Figure 3B:
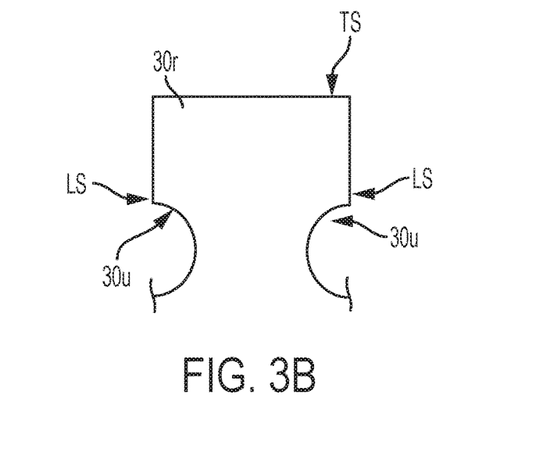
FIG. 3B depicts a simplified view of FIG. 3A according to embodiments of the invention.

The top surface TS generally extends parallel to the plane (x, y) in the accompanying drawings (see, e.g., FIGS. 3A and 3B). As best seen in FIG. 3B, the two lateral surfaces LS generally extend, each, perpendicular to the plane (y, z). Although the lateral surfaces LS are structured and thus have a non-straight profile in the plane (y, z), they roughly extend, each, parallel to the plane (x, z). The top surface connects the two lateral surfaces LS. A raised portion 30r typically has an elongated shape, like a profiled rail that longitudinally extends along axis x, as in the example of FIGS. 1-3. Top surface TS of raised portion 30r is elevated with respect to neighboring (recessed) portions of the substrate.

As best seen in FIG. 3B, each of the two lateral surfaces LS includes a respective undercut 30u, which results in the non-straight profile of the raised portion 30r in the plane (y, z). The undercuts (or back drafts) 30u can notably be formed, each, as a relief groove. The undercuts 30u particularly extend, on the one hand, parallel to each other along lateral sides of the raised portion 30r, and on the other hand, parallel to (and particularly offset from) the top surface TS of the raised portion 30r.

The two electrodes 11, 12 form an electrode pair. Numeral references 11, 12 actually refer to distinct types of electrode pairs, meant to accommodate distinct components of the circuit, as in embodiments of the invention discussed later in detail. Each pair of electrodes 11 and 12 exhibits electrode portions that face each other. The electrodes (and the electrode pair as a whole) are dimensioned so as to support an electromagnetic field (EMF) that allows the circuit 1 to be operated in the microwave domain. That is, the electrodes (and the electrode pair as a whole) are to have characteristic dimensions that are compatible with an EMF in the microwave domain. The microwave domain extends between 300 MHz and 300 GHz, in frequency, which approximately corresponds to a wavelength span of 1 mm to 1 m. Some example electrode dimensions are discussed later.

As further seen in FIG. 3A, each electrode (electrode pair 11 and/or electrode pair 12) includes a protruding structure 17. Accordingly, any electrode pair 11, 12 gives rise to two protruding structures 17. Each protruding structure 17 includes a potentially superconducting material 10 (referred to as a superconducting material in the following). That is, this material 10 typically includes a material such as aluminum (Al) or titanium nitride (TiN), which can become superconducting under certain conditions of temperatures and magnetic fields.

Figure 4A:
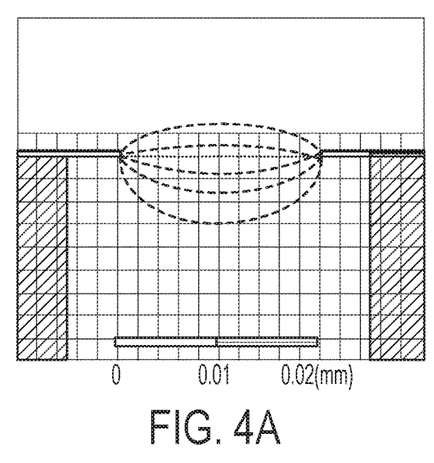
FIG. 4A depicts a cross-sectional view of an electrode geometry with a corresponding electromagnetic field energy density superimposed according to embodiments invention.
Figure 4B:
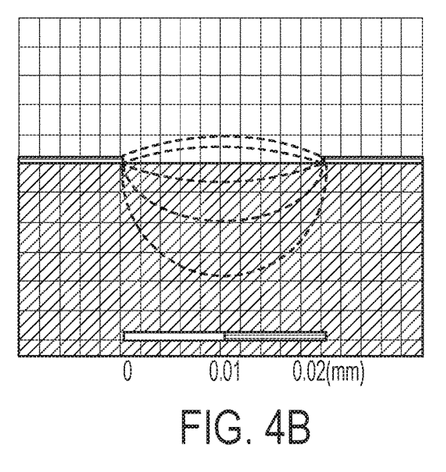
FIG. 4B depicts a cross-sectional view of an electrode geometry with a corresponding electromagnetic field energy density superimposed according to embodiments invention.
Figure 4C:
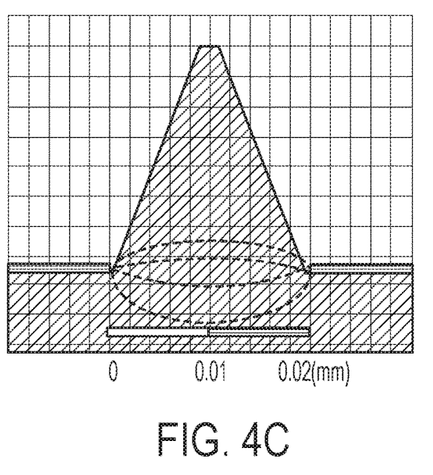
FIG. 4C depicts a cross-sectional views of an electrode geometry with a corresponding electromagnetic field energy density superimposed according to embodiments invention.
Figure 4D:
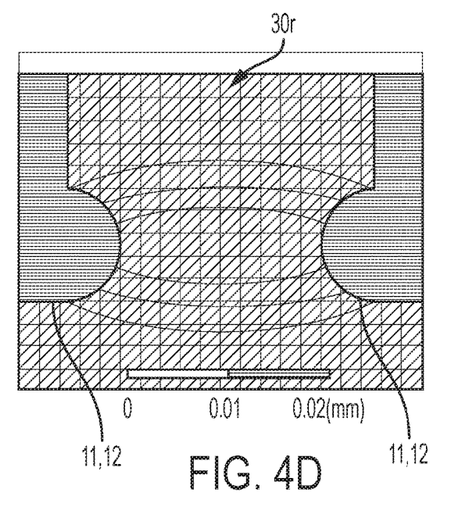
FIG. 4D depicts a cross-sectional views of an electrode geometry of FIGS. 3A and 3B with a corresponding electromagnetic field energy density superimposed according to embodiments invention.

Each structure 17 is shaped complementarily to a respective undercut 30u as can be seen FIGS. 3A and 3B. This way, each structure 17 protrudes toward the other electrode of the pair 11, 12. The electrodes are particularly coated with a layer of superconducting material 10. The thickness of layer 10 will typically range from a few nanometers (e.g., 4 nm) to 30 nm. Fabrication methods and materials contemplated herein impose an upper bound to this thickness (~30 nm). This layer 10 should be made as thick as possible (e.g., close to 30 nm). An electrode can actually be made from this layer 10, which then completely fills the electrode, as depicted in FIG. 4D). In variants, an additional (electrically conducting) filler material 20 can be deposited on top of this layer 10, to complete the electrode 11 and 12. Note, the material 20 extends up to the top surface of the raised portion in the example of FIG. 3A, contrary to the cross-sections shown in FIGS. 1, 2. The filler material 20 can for instance be a metal or any good electrical conductor. The material can otherwise be a potentially superconducting material, and possibly the same material as used for layer 10.

Because the protruding structures 17 of the electrodes 11, 12 extend in the neck of the raised portion 30r, i.e., under the roof of the raised portion 30r, and because a conducting layer 20 typically coats the layer 10, the structures 17 can be regarded as being buried under the top surface of the substrate 30 (the top surface defined by the top surface TS of the raised portion). Also, because a raised portion 30r will typically have a profiled rail-shape (in FIGS. 3A and 3B), which longitudinally extends along x (see FIG. 1B, 2B or 2C), the protruding structures 17 will extend longitudinally, on the one hand, parallel to each other along the neck of the raised portion 30r, and on the other hand, extend parallel to the top surface TS of the raised portion 30r. The tips of the protruding structures 17 (i.e., the protruding apices that are inwardly and laterally offset along axis y) are further offset from the top surface TS along axis z.

The undercut regions can be distinctly offset from the top surface TS (in FIGS. 3A and 3B), so as to define vertical spacing portions 15 for the electrodes. In that case, the protruding portions 17 are distinctly offset from the top surface TS of the raised portion 30r. In some implementations, though, the upper profiles of the undercuts 30u can reach the top surface TS of a respective raised portion 30r.

According to the above geometry, the protruding structures 17 determine a minimal distance (e.g., the horizontal gap in FIG. 3A) between the two electrodes 11 and 12 of each electrode pair. This minimal distance is situated under the top surface TS of the raised portion 30r of the substrate. This top surface TS defines an interface between the structure 10-30 and an environmental gas 90 (e.g., air) or a protective coating (e.g., a deposited polymer or oxide), if any, as in embodiments of the invention discussed below. Because the laterally protruding tips of the structures 17 are recessed with respect to the top surface TS, the EMF supported by an electrode pair 11, 12 will have an energy density (ED) that is confined in the structure 10-30, under the top surface TS, in operation (see FIG. 4D). In fact, the proposed geometry not only confines the EMFED under the top surface TS of the substrate 30, but also reduces the participation ratio of the surface to air (SA) interface, as opposed to electrode geometries (FIGS. 4A-4C).

According to embodiments of the invention, the present electrode geometry makes it possible to reduce microwave losses in microwave-driven devices such as superconducting devices, by confining the EMFs more strongly in the substrate 30 and reducing their maximum intensity. Meanwhile, the proposed electrode geometry reduces the participation ratio of the surface to air (SA) interface, which have been identified to be a limiting factor (by the experimenters) for qubit coherence times in superconducting qubits and for intrinsic quality factors in other devices such as coplanar waveguides (CPWs) and CPW resonators. According to embodiments of the invention, the proposed geometry also makes it possible to reduce peak field energy densities compared to known electrode designs, in turn, further reduce losses in devices such as superconducting microwave circuits.

More generally, the present circuits 1 exhibit more than one raised portion 30r, or structured portions 30r, so as to couple to circuit components such as a CPW, a CPW resonator, a strip line, a slot line or a qubit, among other examples.

In embodiments of the invention, the inwardly protruding structures 17 form convex structures, as in FIG. 3A. For example, a structure 17, as seen from the other electrode, has a fully convex shape. In some embodiments of the invention, however, each of the protruding structures 17 can have a more complex shape and cross-sectional profile, involving both concave and convex portions (not shown). Still, the general shape of a structure 17 would nevertheless protrude, as a whole, toward the other electrode.

As further provided in FIGS. 1-3, each of the electrodes 11, 12 are structured so as to form a single convex structure 17, be it to ease the fabrication process. In some embodiments of the invention, however, each electrode can include two or more protruding structures, such as the structure 17, which protrude, each, toward the other electrode.

As best seen in FIG. 3A, each convex structure 17 has a rounded shape. In some embodiments of the invention, however, the convex structure 17 can have a roughly polygonal profile. According to tests and simulations performed by the experimenters, best results (in terms of EMF confinement) are obtained with rounded shapes according to embodiments of invention.

Moreover, a number of other parameters happen to have an impact on the confinement of the EMF energy density (EMFED), starting with the dimensions of the electrodes and distances between electrodes of an electrode pair, as discussed below. For instance, the maximal extension of the convex structure 17 of each electrode 11, 12 should be between 200 nm and 100 µm. This extension is measured perpendicularly to the top surface TS, i.e., along axis z. This extension corresponds to the maximal vertical dimension of the convex structure 17, i.e., along a vertical axis contained in the plane of the upper lateral surface 15, see FIG. 3A. Better results, in terms of EMFED confinement, can be achieved if then maximal extension is between 1 µm and 10 µm, accordingly to simulations.

As further seen in FIG. 3A, the electrodes 11, 12 exhibit opposite portions 15, 17, which are symmetric (or essentially symmetric) under reflection through the bisecting plane denoted by a vertical dashed line in FIG. 3A, in which the dashed line is perpendicular to the top surface TS. The opposite portions 15, 17 include, each, an inwardly protruding structure 17 such as described above. In the example of FIG. 3A, the convex structures 17 protrude toward each other, so as to be symmetric (or essentially symmetric) with respect to said bisecting plane. "Essentially symmetric" means that, although the opposite portions 15, 17 can appear roughly symmetric, small residual deviations to the perfect symmetry can possibly be observed, because of uncertainties (or tolerances) in the fabrication process. Such deviations will normally have dimensions that are substantially smaller (e.g., ten times less) than the characteristic dimensions of the electrodes 11, 12 or components thereof (e.g., protruding structures 17 and spacing portions 15).

As further exemplified in FIGS. 3A and 3B, the undercuts 30$u$ are distinctly offset from the top surface TS. This way, the offset undercuts 30$u$ define an upper spacing portion 15 for each of the electrodes. Each spacing portion extends downwardly from the top surface TS. Accordingly, each convex structure 17 extends below an end of a respective spacing portion 15, so as to be distinctly offset from the top surface TS. A spacing portion 15 is otherwise determined by an upper residual portion the roof of the raised portion 30$r$ of the substrate 30, above the undercuts 30$u$ according to which said protruding structures 17 are conformally patterned. The vertical dimension of the spacing portions 15 is another parameter that can be optimized, to optimize, in turn, the EMF strength.

In general, the larger the vertical offset of the convex structures 17 with respect to the top surface TS, the better the results in terms of EMF confinement. In addition, simulations and experiments conducted by the experimenters show that improved EMF confinements can be obtained by reducing the minimal distance between opposite structures 17 and by increasing the size (lateral depth) of the undercut, which roughly corresponds to the radius (or the maximal horizontal extension) of the protruding features 17, according to embodiments of the invention.

Therefore, in embodiments of the invention, the undercuts 30$u$ are patterned in such a manner that a tip of each of the convex structures 17 is offset from the top surface TS by a distance that is between 200 nm and 100 µm. As discussed herein, this tip corresponds to the apex of the protruding structure, i.e., the end that is the most laterally offset (along axis y) in this structure 17. This tip is more particularly offset from the top surface TS by a distance that is between 1 and 50 µm, or even, between 2 µm and 10 µm.

The radius (or maximal extension along y) of the protruding features 17 is typically on the same order of magnitude as the vertical offset (along z), i.e., between 200 nm and 100 µm, though the magnitude is particularly larger than the radius. Still, both the electrode radius and vertical offset should typically be on the same order of magnitude as the separation (along y) between the two protruding features 17.

As seen in FIGS. 1B, 1C, 1D, 2B, 2C, 2D and 2E, the substrate 30 can have two or more raised portions 30$r$. In addition, a raised portion 30$r$ can be structured so as to exhibit distinct sections (FIG. 1B). More generally, the substrate 30 can include n raised portions 30$r$ or $n$ local sections of a same raised portion, where n≥2 and each of the n raised portions (or local sections) is generally structured like the raised portion 30$r$ shown in FIGS. 3A and 3B. This way, n electrode pairs can be formed about the n portions 30$r$ or the n local sections of a same portion 30$r$. Note, however, that some of the electrode pairs can be connected, e.g., two-by-two, as in FIG. 2E, such that the n electrode pairs can involve less than 2n electrodes. For example, two neighboring features 30$r$ can define two electrode pairs where the middle electrode is shared by the two pairs, as in FIG. 2D.

Figure 2A:
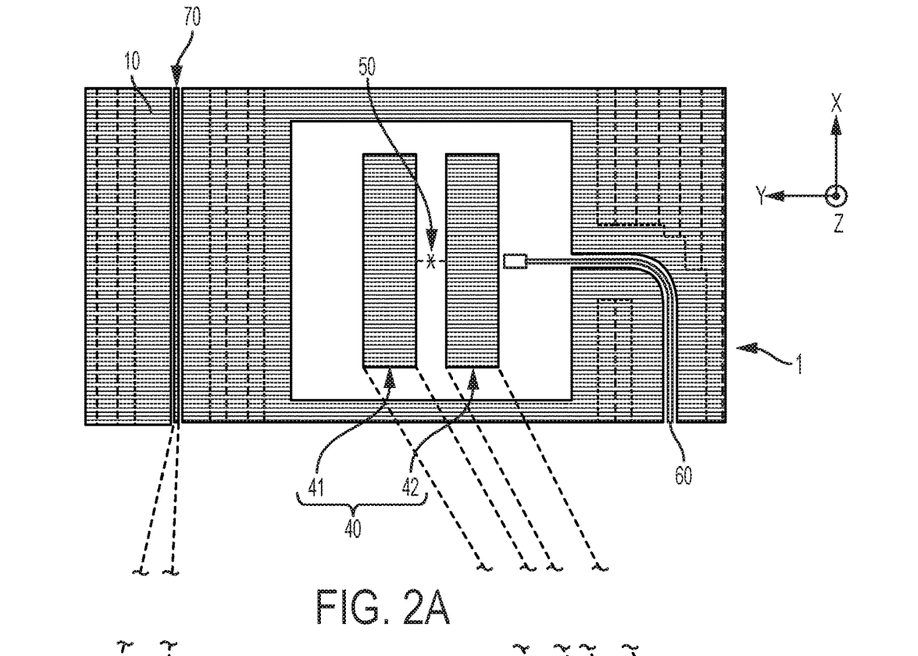
FIG. 2A depicts a top view of a larger portion of the superconducting microwave circuit in FIG. 1A, which further shows a coplanar waveguide and a control line, according to embodiments of the invention.
Figures 2B, 2D:
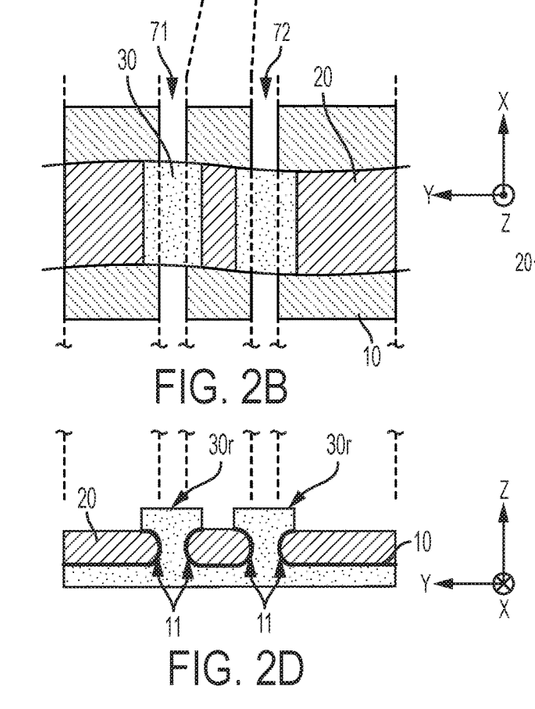
FIG. 2B depicts magnified selected portions of FIG. 2A corresponding to a coplanar waveguide resonator, where the substrate and the conducting material are only visible along a curved strip, according to embodiments of the invention.
FIG. 2D depicts a cross-sectional view of FIG. 2B according to embodiments of the invention.
Figure 2C:
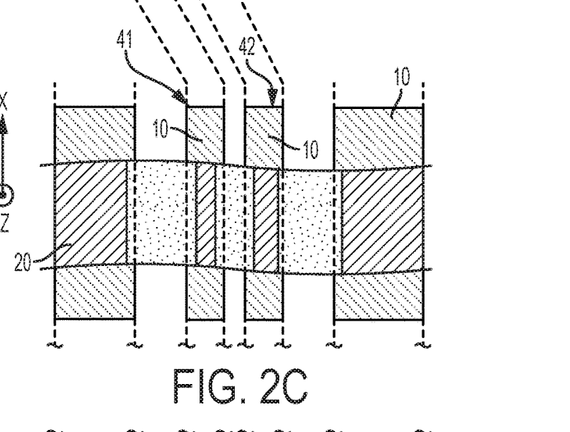
FIG. 2C depicts magnified selected portions of FIG. 2A corresponding to a qubit, where the substrate and the conducting material are only visible along a curved strip, according to embodiments of the invention.
Figure 2E:
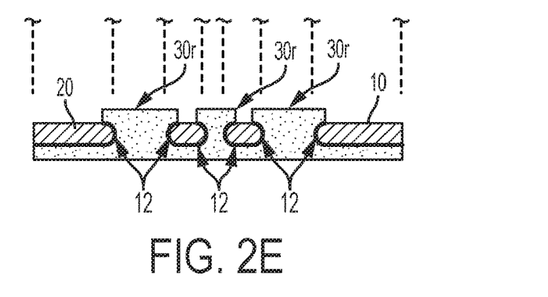
FIG. 2E depicts a cross-sectional view of FIG. 2A according to embodiments of the invention.

FIG. 2A is a top view of a larger portion of the superconducting microwave circuit 1, which shows a coplanar waveguide and a control line. FIGS. 2A-2C are top views, while FIGS. 2D and 2E are cross-sectional views corresponding to FIGS. 2B and 2C, respectively. As in FIG. 1A, the substrate and the conducting material are not shown in FIG. 2A. FIGS. 2B and 2C magnify selected portions of FIG. 2A (respectively corresponding to a coplanar waveguide resonator and a qubit), where the substrate and the conducting material are only visible along a curved strip.

Referring now to FIGS. 2A and 2D, the circuit 1 can have a coplanar waveguide (CPW) 70, which can be accommodated by two raised portions, as in embodiments. The CPW 70 includes a conducting track and a pair of return conductors on either side of the track. The return conductors are separated from the conducting track by respective gaps 71, 72 that are filled by the necks of the raised portions. As further seen in FIG. 2D, opposite pairs of undercuts 30$u$ (seen in FIGS. 3A and 3B but not labeled in FIG. 2D) of the two raised portions extend longitudinally along x and along a respective one of the gaps 71, 72. Each of the protruding structures 17 of electrodes 11 (of each electrode pair) protrudes inwardly, along the direction y (i.e., the direction perpendicular to the longitudinal direction of extension of the respective gap). In other words, each electrode pair sandwiches a longitudinal gap 71, 72. The CPW 70 is suitably dimensioned so as to convey microwave-frequency signals. The CPW 70 can notably be used for the coupling of microwave photons to a superconducting qubit, as discussed later.

In the example of FIGS. 2B and 2D, the CPW 70 is assumed to be configured in the circuit 1 as a CPW resonator 70. Particularly, the gaps 71, 72 are coupled (at regular intervals) by coupling features such as transverse coupling gaps (filled by residual portions of the substrate 30 in the center pin) or coupling shorts. Such coupling features are not visible at the scale of FIG. 2A.

CPW resonators allow for high EMF strength and thus strong couplings, e.g., to a superconducting qubit, by confining a microwave photon to a volume much smaller than the cube of the wavelength. More generally, CPW resonators can also be used as quantum buses to couple multiple qubits (not shown).

As otherwise illustrated in FIGS. 1A and 2A, some of the raised portions 30r formed in the substrate 30 are structured so as to separate/rejoin, thereby forming bifurcations (in-plane with the substrate 30), as denoted by rounded dots in the inset in FIG. 1B. In the example of FIGS. 1A and 2A, one raised portion 30r is structured so as to form two bifurcations. More generally though, the raised portions can be structured to accommodate various types of circuit components, which can give rise to one or more bifurcations. A bifurcation can give rise to two or more local sections of a raised portion in a cross-sectional plane perpendicular to the top surface TS and the lateral surfaces LS of the raised portions 30r.

This way, a single raised portion 30r can be structured so as to accommodate such geometric structures as capacitor plates (or arms). This is particularly the case where the raised portions are formed around capacitor plates of a superconducting qubit, as assumed in FIGS. 1B, 1C, 1D, 2C, and 2E. In FIGS. 1C and 2E, the substrate is structured so as for a raised portions 30r to separate and rejoin at two bifurcations (FIG. 1B, inset), this gives rise to three apparent raised portions (or local sections) in cross-section, as rendered in FIG. 1C. A similarly structured substrate is seen in FIG. 2C. In each case, the three apparent sections 30r are adjoined by four apparent electrode sections, which actually correspond to three distinct electrodes, involving respective portions of superconducting material 10.

In the variant of FIG. 1C, the substrate is not interrupted at the level of the thick dashed line (FIG. 1B), though its width is reduced, such that a residual (middle) section of the raised portion is visible in the corresponding cross-section (FIG. 1C). In the variant of FIG. 1D, the substrate is assumed to be fully interrupted between the two capacitor plates, at the level of the thick dashed line (FIG. 1B), such that no middle section is to be seen in the corresponding cross-section (FIG. 1D).

Additional features shown in FIGS. 1, 2 will now be described in reference to embodiments of the invention where the superconducting circuit 1, 1a, 1b is (or forms part of) a quantum processing device that includes one or more superconducting qubits 40-60. Only one qubit is shown in FIGS. 1, 2, for conciseness. Each qubit 40-60 includes a pair of capacitor plates 41, 42, which are coupled via a Josephson junction 50.

As discussed earlier, a given raised portion 30r of the substrate can be structured so as for adjoining electrodes to couple with the capacitor plates. The raised portion exhibit undercuts extending along the capacitor plates. The Josephson junction 50 is formed in a superconducting layer 10a, 10b (shown in FIGS. 1C and 1D, respectively) that extends between the capacitor plates, from one undercut portion to the opposite one.

As discussed herein, the raised portion can be interrupted at the center, as in FIG. 1D, hence yielding only two apparent raised portions in the cross-section (at the level of the cutting plane defined by the thick dashed line of FIG. 1B). In embodiments of the invention, the raised portion is structured so as to give rise to three apparent raised portions 30r in cross-section, this including the residual, middle section between the capacitor plates, as seen in FIG. 1C or 2E. In all cases, edges of the raised portion extend along and around edges of the capacitor plates 41, 42, as seen in FIGS. 1B and 2C.

In the examples of FIGS. 1, 2, undercuts 30u in the substrate 30 extend not only around the capacitor plates but also along the surrounding structure, which is formed by a structured layer stack of materials 10 and 20, see FIGS. 1B, 1C, 1D. This results in two or three apparent electrode pairs, in cross-section, depending on whether the middle portion is interrupted or not. Each electrode pair sandwiches an apparent section of the raised portion, in cross-section.

The Josephson junction 50 may be formed on top, in a superconducting material layer 10a patterned on top of the middle section of the substrate 30, between electrodes corresponding to the plates 41, 42, as in the circuit 1a shown in FIG. 1C. In variants, the Josephson junction 50 is formed in a superconducting layer 10b, patterned on the bottom of the interrupted section, as in the circuit 1b shown in FIG. 1D. This way, the Josephson junction is recessed with respect to the top surface of the raised portion.

In both cases, the Josephson junction 50 can for instance be realized by etching a thin wire into a superconducting material 10, such that this wire connects electrode portions and acts as a weak link junction. In practice, multiple superconducting (e.g., transmon-type) qubits can be used (not shown).

For completeness, the qubits can serve as computational qubits or as couplers in the quantum processing device, which couplers can have a fixed or tunable frequency in practice. For example, the frequency of the coupler can be modulated so as to drive energy transitions in the quantum processing device. In other words, energy transitions in the system can be driven by applying harmonic microwave signals (i.e., coherent microwave tones) to the tunable coupler. A controller (e.g., including one or more control lines 60), can be used to apply harmonic microwave signals to components of the circuit and trigger the desired transitions. This can notably require adjusting amplitudes and phases of the signals applied, in addition to modulating their frequency.

The above embodiments of invention have been succinctly described in reference to the accompanying drawings and may accommodate a number of variants. Several combinations of the above features may be contemplated. Examples are given in the next section.

FIGS. 5A, 5B, 5C, 5D, 5E, 5F and 5G depict cross-sectional views of fabricating a superconducting microwave circuit 1, 1a, 1b according to embodiments of the invention.

This method requires a substrate 30 (e.g., intrinsic silicon, an insulating, high-quality dielectric substrate, or a high-quality layered substrate), which is patterned (FIGS. 5A-5E) so as to obtain a raised portion 30r, e.g., a single portion (possibly structured, so as to have several sections as in FIG. 1B), or more than one portion 30r. This is performed so that the raised portion(s) 30r to include a top surface TS and two lateral surfaces LS, wherein the top surface connects the two lateral surfaces LS, in which respective undercuts 30u are patterned (FIG. 5E), as described earlier in reference to FIGS. 1-3.

Next, two electrodes 11, 12 are complementarily patterned (FIGS. 5F and 5G) to form an electrode pair, wherein each electrode includes a structure 17 that includes a superconducting material 10 and is shaped complementarily to a respective undercut 30u. Two protruding structures 17 are obtained, which protrude, each, toward the other electrode of the pair. As noted above, the electrode pair must be dimensioned so as to support an EMF, for the circuit to be operated in the microwave domain.

The substrate 30 is particularly patterned so as to form (FIGS. 5D and 5E) opposite, concave undercuts 30u. The structures 17 subsequently patterned will accordingly form inwardly protruding, convex structures. The opposite, concave undercuts 30u can for example be formed by etching (FIG. 5D) an oxide mask 6 deposited on the substrate 30 and subsequently etching (FIG. 5E) the substrate 30, isotropically, with the etched oxide mask. This way, rounded and concave undercuts can be obtained.

After having formed the opposite undercuts 30u, the patterned substrate 30 can for instance be coated (fully, as in FIG. 5G, or partly, using a mask) with a layer 10 of superconducting material. If desired, a conducting layer 20 is next deposited, which is further patterned, so as to achieve a device such as described earlier in reference to FIGS. 1-3.

Figures 5A, 5C:
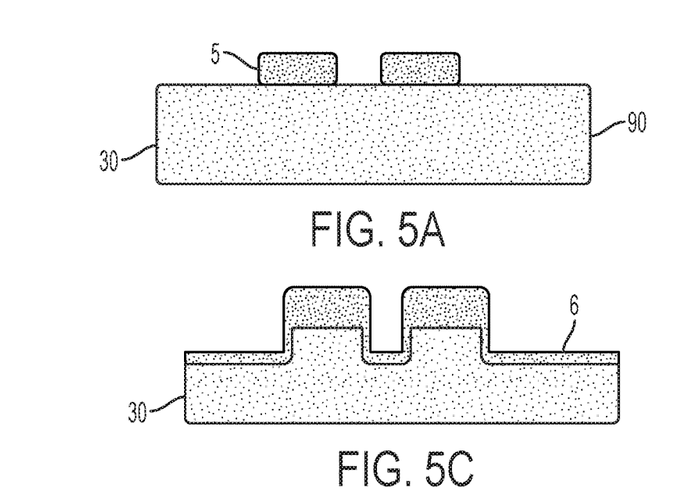
FIG. 5A depicts a cross-sectional view of a superconducting circuit, prior to depositing a conducting layer on the superconducting layer, according to embodiments of the invention.
FIG. 5C depicts the superconducting circuit of FIG. 5B after fabrication operations according to embodiments of the invention.
Figure 5B:
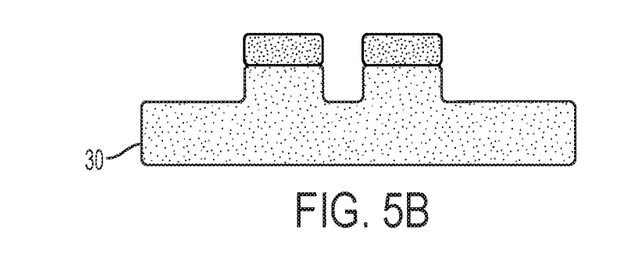
FIG. 5B depicts the superconducting circuit of FIG. 5A after fabrication operations according to embodiments of the invention.
Figure 5D:
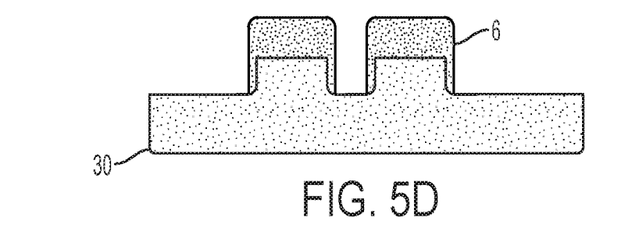
FIG. 5D depicts the superconducting circuit of FIG. 5C after fabrication operations according to embodiments of the invention.
Figure 5E:
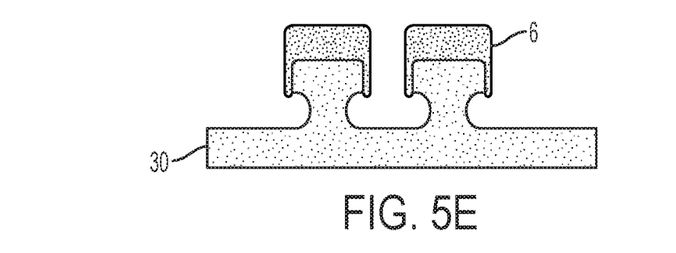
FIG. 5E depicts the superconducting circuit of FIG. 5D after fabrication operations according to embodiments of the invention.
Figure 5F:
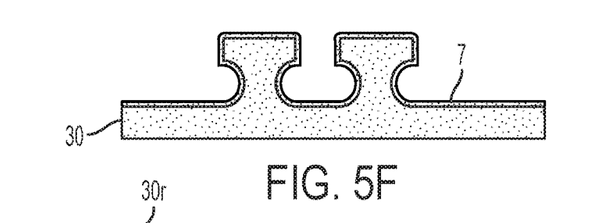
FIG. 5F depicts the superconducting circuit of FIG. 5E after fabrication operations according to embodiments of the invention.
Figure 5G:
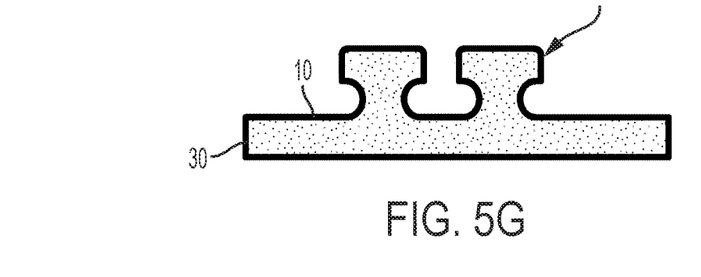
FIG. 5G depicts the superconducting circuit of FIG. 5F after fabrication operations according to embodiments of the invention.

FIGS. 5A-5G pertain to particular embodiments of the invention, wherein a masking oxide 5 (e.g., thermal silicon oxide) is deposited onto the surface of the substrate 30, FIG. 5A. The thickness of layer 5 is typically chosen in the range of 10 nm-1000 nm, according to the selectivity of the etch in the next step. Eventually, the lateral separation between the two electrodes can be, e.g., between 0.1 and 1000 μm. The necessary etch depth and undercut scale with the electrode separation (the field confinement effect remains constant for a rescaling of all length scales). A small electrode separation (e.g., 1 μm) will limit the sum of thicknesses of the oxide mask and the metal deposition to about one half of that value (e.g., 0.5 μm). FIG. 5B illustrates a directed selective etching of the substrate material (e.g., silicon), using reactive ion etching (RIE) or a similar technique. FIG. 5C depicts a conformal deposition of an oxide 6, which can be obtained by oxidizing the substrate or by deposition of another masking material that is not etched by the isotropic etching of FIG. 5E. FIG. 5D shows the removal of the bottom protection layer by directed dry etching. This can involve a large vertical physical etching component that is material unspecific. FIG. 5E illustrates the isotropic etching of the substrate, e.g., using gaseous $XeF_2$, interhalogen etch chemistries or wet etching with hydrofluoric nitric acid (assuming a Si substrate). This step creates a half round geometry for the required undercuts. This shape can be distorted using plasma-based etching techniques, in order to achieve a more pronounced undercut, or more triangular shapes with a maximum undercut farthest from the top surface. As illustrated in FIG. 5F, the surface of the buried structures can optionally be made smoother by repeated thermal oxidation and stripping of the oxide. FIG. 5G shows an isotropic deposition of the superconducting layer 10, using physical vapor deposition (PVD), chemical vapor deposition (CVD), hybrid physical-chemical vapor deposition (HPCVD), or atomic layer deposition (ALD). The conformal deposition of the superconductor electrodes is typically done after a surface treatment, e.g., an HF-last process which leaves a silicon surface H-passivated. For example, ALD deposited TiN thin films (20 nm thick) on Si become superconducting at about 3K. Since such films can be annealed at very high temperatures they are promising candidates to realize good substrate-superconductor interfaces.

Alternatively and/or additionally, the superconductor 10 could be deposited directly after FIG. 5E and the oxide could be used as a mask for a conformal deposition that, after removal of the oxide, leaves only the buried rounded electrodes. An example is the conformal deposition of a metal such as platinum, tungsten or tantalum (e.g., using ALD), which after annealing forms a silicide with the silicon substrate that will turn superconducting. The remaining metal on the oxide mask can selectively be etched away.

Figure 6A:
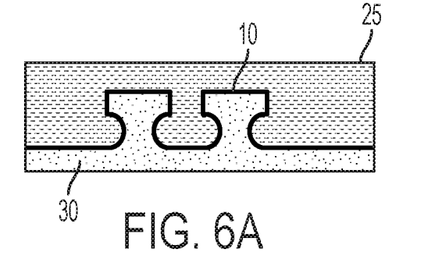
FIG. 6A depicts the superconducting circuit of FIG. 5G after deposition of the overlaying conducting layer according to embodiments of the invention.
Figure 6B:
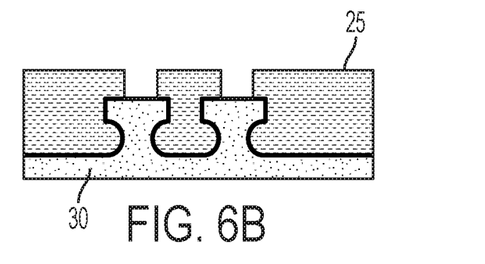
FIG. 6B depicts the superconducting circuit of FIG. 6A after further fabrication operations according to embodiments of the invention.
Figure 6C:
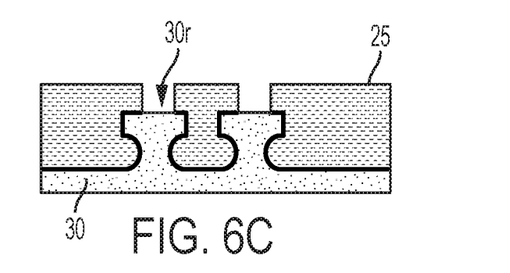
FIG. 6C depicts the superconducting circuit of FIG. 6B after further fabrication operations according to embodiments of the invention.
Figure 7A:
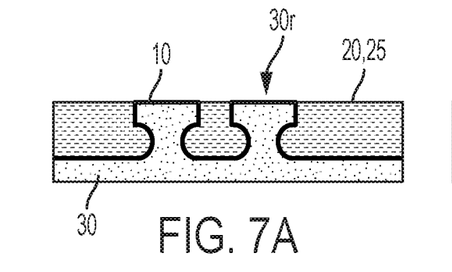
FIG. 7A depicts the superconducting circuit of FIG. 5G after deposition of the overlaying conducting layer according to embodiments of the invention.
Figure 7B:
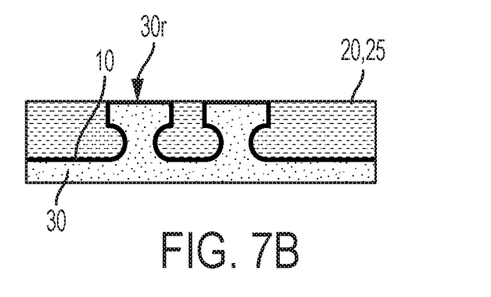
FIG. 7B depicts the superconducting circuit of FIG. 7A after further fabrication operations according to embodiments of the invention.
Figure 8A:
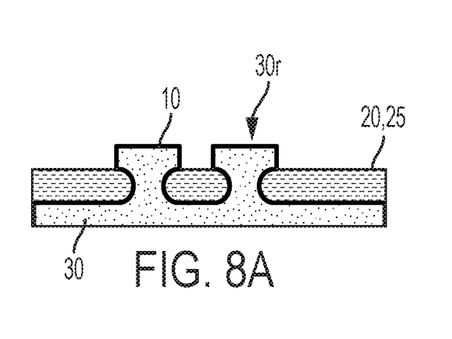
FIG. 8A depicts the superconducting circuit of FIG. 5G after deposition of the overlaying conducting layer according to embodiments of the invention.
Figure 8B:
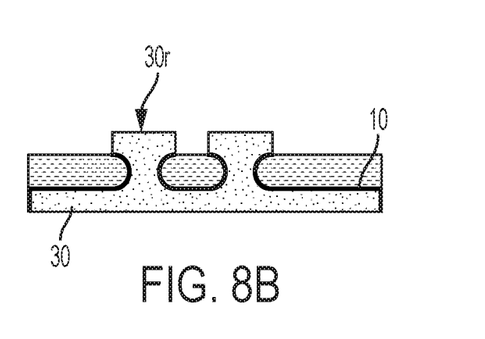
FIG. 8B depicts the superconducting circuit of FIG. 8A after further fabrication operations according to embodiments of the invention.

Various additional patterning steps can then be performed, in order to remove shorts between the electrodes. Various scenarios can be contemplated, as illustrated in FIGS. 6B, 6C, 7B, and 8B. In each case, an additional layer of material 20, 25 is relied upon, which can be a resist, an oxide or a masking layer (all denoted by the same numeral reference 25) that can be exposed using lithography (FIGS. 6-8), or a (super)conductor layer 20 (is also possible in the embodiments of FIGS. 7, 8). In FIGS. 6A, 6B, 6C, the top surface TS of the raised portions 30r is initially recessed with respect to a top surface of the overlaying material 25. The layer 25 is initially deposited (FIG. 6A), then opened on top (FIG. 6B) and the superconducting film 10 is then etched (FIG. 6C) at the level of the opened trenches to interrupt the layer 10, as needed to achieve electrode pairs (with three apparent electrode layer portions in this example). In FIGS. 7A and 7B, the top surface of the raised portions is initially level (FIG. 7A) with the top surface of the deposited layer 20/25 (i.e., a resist or mask 25, or still a (super)conductor 20). The top surface is planarized (FIG. 7B) to remove top portions of layers 10 and 20/25. In FIGS. 8A and 8B, the top surface of the raised portions 30r initially protrudes from the top surface of the deposited layer 20/25 (FIG. 8A). An additional etching step is used (FIG. 8B) to selectively remove top portions of the electrode layer 10. Note, the layer 20/25 seen in FIGS. 7-8 is used to fill some space between the raised portions 30r. Now, this layer can also be a (super)conducting material 20 that directly acts as a mask for, e.g., wet etching. Layer 20 can for instance be a superconductor or a good normal conductor (e.g., for quasiparticle trapping).

In general, the upper superconductor portions 10 can be removed using selective etching, planarization techniques such as chemical mechanical polishing (CMP) or other lithographic techniques. The removal of the top superconductor layer 10 allows the "shorts" between the buried electrodes to be selectively removed. Somewhat more sophisticated lithographic techniques can be used to achieve a Josephson junction and bridge neighboring electrodes, as understood by one skilled in the art.

If desired, residual portions of resists, oxides or mask layers 25 can subsequently be removed, i.e., after having removed the top shorts between the electrodes (e.g., according to techniques discussed above in reference to FIGS. 6-8), in order to coat the exposed layer 10 with an electrically conducting material 20. The space then filled by the deposited material 20 shall nevertheless be nearly field-free in practice (this depending on the thickness of layer 10). The deposition of material 20 can for instance be achieved with a plating technique, using either superconducting materials such as In or Sn or a normal metal (e.g., Cu), which can potentially act as a quasiparticle sink or a cooling reservoir for the superconducting film 10.

Again, the deposition of the material 20 is optional. The space between the raised portions 30r can optionally be filled with other materials, as discussed above in reference to FIGS. 6 and 7, or, simply, a sufficiently thick superconducting material 10 can be used in the first place, making it necessary to add a filler material 20.

Further information regarding technical implementation and particular geometries is discussed. There can be particular geometries, wherein two rounded, buried electrodes 17 approach each other below the top substrate surface TS, so as to concentrate the EMFED in the (high-quality) substrate material 30 (intrinsic Si) rather than at the SA interface. The geometry is achieved by pre-structuring the substrate 30 using known etching techniques, before depositing a superconducting metal layer 10 for the electrodes (e.g., meant to sustain a microwave field in qubits, resonators or CPWs). The combination of directed and isotropic etching allows a rounded, buried underetch to be achieved below the substrate surface, using conformal deposition of the superconducting material (e.g., with CVD, or ALD), as described above. The underetch can notably be covered with a superconductor material such as, e.g., TiN or Al.

Various experiments, as well as 2D simulations of the EMF distribution performed on various geometries, have shown that embodiments of the invention result in a substantial reduction of the SA participation ratio (at least by a factor 7 in some cases) and an increased capacitive coupling (by a factor 2 or more). In practice, this means that qubits can be made smaller at fixed $E_C$ (charging energy), while the reduced SA participation is expected to yield longer $T_1$ times for qubits or higher $Q_i$ values for CPW resonators.

Various EMF Simulations were performed by experimenters. The basic simulation setup involves two metal electrodes (perfect conductors) that are separated by a 20 μm gap and have a maximal width of 110 μm each (along y). The substrate is chosen to be silicon (Si), and the SA interface contribution was calculated by integration of the electromagnetic field energy density in a volume starting 2 nm above the substrate surface (along z) and 20 nm thick (in that same direction), extending along the substrate surface between the two metal electrodes. Field energy densities were calculated for an arbitrary potential of ±1 V applied across the electrode pair. FIGS. 4A-4D show approximate field energy density contours for some of the geometries simulated. FIGS. 4A-4C relate to state-of-the-art electrode geometries. FIG. 4D corresponds to the geometry of FIGS. 3A and 3B. In each case, contour lines (dotted lines) corresponding to the electromagnetic field energy density are superimposed on the views. The electromagnetic field energy densities were obtained in each case based on a simulation setup allowing consistent comparisons to be made.

FIG. 4A assumes overhanging electrodes, separated by a wide trench. Here, the increased participation of the lateral substrate surfaces reduces the improvement obtained from bringing the electromagnetic field energy density out of the substrate and away from the top surface. FIG. 4B is a standard planar electrode design that is typically achieved by etching an Al or Nb film using dry etching techniques. FIG. 4C assumes a slanted design (which concentrates the field in the substrate but does not gain much in the SA participation), while FIG. 4D depicts an electrode geometry according to embodiments of the invention (with rounded, protruding structures).

A particular parameter here is the undercut under the superconductor, which dramatically reduces the SA participation in FIG. 4D, according to embodiments of the invention. In FIG. 4D, the undercuts are assumed to be 2.5 μm long (along x), while the electrodes are 20 μm deep (along z). Several variants were actually simulated, using realistic depth and thickness values. Best results were achieved for rounded electrodes separated by 20 μm or less (along y) and spacing portions 15 with a depth of 10 μm or more. More discussion regarding these improvement is provided. First, the field concentration at a finite depth in the substrate leads to less field energy at the SA interface (reduction of SA interface participation and improvement of quality factor or lifetime). Second, the round and extended nature of the buried electrodes leads to smaller maximum values of the energy density at any given point in the structure (smaller coupling to two-level system (TLS) defects). Third, the reduction of the evanescent fields in air 90 above the substrate leads to less cross-coupling between resonant structures (reduced cross-talk). Such simulations indicate that qubit dimensions can be reduced by a factor 10 (i.e., 10 times smaller) or, conversely, the SA interface participation can be improved by a similar factor (i.e., 10 times better).

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A superconducting microwave circuit comprising:
   a substrate having a raised portion, which includes a top surface and two lateral surfaces, wherein the top surface connects the two lateral surfaces, the two lateral surfaces comprising respective undercuts; and
   two electrodes forming an electrode pair, wherein:
      each of the two electrodes comprises a structure that includes a potentially superconducting material and is shaped complementarily to a respective one of the undercuts, so as to protrude toward another one of the two electrodes, thereby forming two protruding structures,
      the electrode pair is dimensioned so as to support an electromagnetic field that allows the circuit to be operated in the microwave domain,
      a maximal extension of the two protruding structures is between 200 nm and 100 µm, wherein the maximal extension is measured perpendicularly to the top surface.

2. The superconducting microwave circuit according to claim 1, wherein the undercuts extend parallel to each other along the two lateral surfaces of the raised portion and extend parallel to the top surface of the raised portion.

3. The superconducting microwave circuit according to claim 1, wherein the substrate comprises n raised portions, n≥2, each of the n raised portions structured as the raised portion, so as to form n electrode pairs.

4. The superconducting microwave circuit according to claim 1, wherein the raised portion has one or more bifurcations in-plane with the substrate, the bifurcations give rise to at least three raised portions in a cross-sectional plane perpendicular to each of the top surface and the lateral surfaces.

5. The superconducting microwave circuit according to claim 4, wherein:
the circuit is a quantum processing device that comprises a superconducting qubit that includes a pair of capacitor plates coupled via a Josephson junction,
the raised portion of the substrate is structured so as for the two electrodes thereof to couple with the capacitor plates, the raised portion exhibiting undercut portions extending along the capacitor plates, and
the Josephson junction is formed in a layer of potentially superconducting material extending between the capacitor plates, from one of the undercut portions to an opposite one of the undercut portions.

6. The superconducting microwave circuit according to claim 5, wherein the Josephson junction is formed in a layer portion of the layer of potentially superconducting material, in which the layer portion extends flat from the one of the undercut portions to the opposite one of the undercut portions, such that the Josephson junction is recessed with respect to the top surface of the raised portion.

7. The superconducting microwave circuit according to claim 1, wherein the protruding structure of each of the two electrodes is a convex structure.

8. The superconducting microwave circuit according to claim 7, wherein each of the two electrodes is structured so as to form a single convex structure.

9. The superconducting microwave circuit according to claim 7, wherein the convex structure has a rounded shape.

10. The superconducting microwave circuit according to claim 7, wherein:
the two electrodes comprise opposite portions, which are substantially symmetric under reflection through a bisecting plane of the opposite portions,
the opposite portions include, each, a respective one of the protruding structures, and
the bisecting plane is perpendicular to the top surface.

11. The superconducting microwave circuit according to claim 7, wherein the undercuts are, each, offset from the top surface, so as to define, for each of the electrodes, a spacing portion that extends from the top surface, the convex structure of each of the electrode being at an end of the spacing portion, so as to be distinctly offset from the top surface.

12. The superconducting microwave circuit according to claim 11, wherein a tip of each of the convex structures is offset from said top surface by a distance that is between 200 nm and 100 μm.

13. A superconducting microwave circuit comprising:
a substrate having a raised portion, which includes a top surface and two lateral surfaces, wherein the top surface connects the two lateral surfaces, the two lateral surfaces comprising respective undercuts; and
two electrodes forming an electrode pair, wherein:
each of the two electrodes comprises a structure that includes a potentially superconducting material and is shaped complementarily to a respective one of the undercuts, so as to protrude toward another one of the two electrodes, thereby forming two protruding structures,
the electrode pair is dimensioned so as to support an electromagnetic field that allows the circuit to be operated in the microwave domain,
the substrate comprises n raised portions, n≥2, each of the n raised portions structured as the raise portion, so as to form n electrode pairs, and
n=2, the circuit further comprising a coplanar waveguide that comprises a conducting track and a pair of return conductors on either side of the track, wherein the return conductors are separated from the conducting track by respective gaps that are filled by respective ones of the n=2 raised portions, such that opposite pairs of the undercuts of the raised portions extend longitudinally along a respective one of the gaps.

14. The superconducting microwave circuit according to claim 13, wherein the coplanar waveguide is configured in the circuit as a coplanar waveguide resonator.

15. A method of fabricating a superconducting microwave circuit, the method comprising:
providing a substrate;
patterning the substrate to obtain a raised portion, which includes a top surface and two lateral surfaces, wherein the top surface connects the two lateral surfaces, the two lateral surfaces comprising respective undercuts; and
complementarily patterning two electrodes to form an electrode pair, wherein
each of the two electrodes comprises a structure that includes a potentially superconducting material and is shaped complementarily to a respective one of the undercuts, so as to protrude toward another one of the two electrodes, thereby forming two protruding structures,
the electrode pair is dimensioned so as to support an electromagnetic field that allows the superconducting microwave circuit to be operated in the microwave domain, and
patterning the substrate comprises forming opposite, concave undercuts, so as to form the protruding structures subsequently patterned to form convex structures.

16. The method according to claim 15, wherein forming the opposite, concave undercuts is carried out by etching an oxide mask deposited on the substrate and subsequently etching, isotropically, the substrate with the etched oxide mask.

17. The method according to claim 15, wherein patterning the substrate further comprises, after forming the opposite undercuts, partly coating the patterned substrate with a layer of the potentially superconducting material.

18. The method according to claim 17, wherein patterning the substrate further comprises, after partly coating the patterned substrate, depositing an electrically conducting material on top of the layer of potentially superconducting material.

* * * * *